United States Patent [19]

Rheault

[11] Patent Number: 4,899,892
[45] Date of Patent: Feb. 13, 1990

[54] EARTHQUAKE-RESISTANT ELECTRONIC EQUIPMENT FRAME

[75] Inventor: Denis J. A. Rheault, Brossard, Canada

[73] Assignee: Northern Telecom Limited, Montreal, Canada

[21] Appl. No.: 165,318

[22] Filed: Mar. 8, 1988

[51] Int. Cl.⁴ .............................................. A47G 19/08
[52] U.S. Cl. ........................................ 211/41; 211/26; 211/72
[58] Field of Search .................... 211/41, 26, 72, 183; 312/257 SM, 253, 100; 361/395, 399, 415, 419, 429; 52/738, 732

[56] References Cited

U.S. PATENT DOCUMENTS

| 3,487,948 | 1/1970 | Haidegger | 211/41 X |
|---|---|---|---|
| 4,074,811 | 2/1978 | Filak | 211/191 |
| 4,153,164 | 5/1979 | Hofmeister et al. | 211/41 |
| 4,447,856 | 5/1984 | Takahashi et al. | 361/415 |
| 4,464,074 | 8/1984 | Green et al. | 211/41 X |
| 4,496,057 | 1/1985 | Zenitani et al. | 361/429 X |
| 4,497,411 | 2/1985 | DeBortoli | 211/26 |
| 4,531,640 | 7/1985 | Shah | 211/41 |

FOREIGN PATENT DOCUMENTS 2074386 10/1981 United Kingdom ................. 361/415

Primary Examiner—Ramon S. Britts
Assistant Examiner—David G. Kolman
Attorney, Agent, or Firm—R. John Haley

[57] ABSTRACT

An electronic equipment frame comprises a base, two vertical elongate side members bolted to the base and extending upwardly therefrom for supporting electronic equipment shelves therebetween, and a top member welded to and extending between upper ends of the side members. Each side member has a relatively wide front lipped flange, providing shelf mounting holes and slots through which cables may pass, and a relatively narrow rear lipped flange, with a central portion extending therebetween. The central portion has an upstanding inverted-V portion positioned between the flanges, which define a cable duct therebetween. The frame has relatively high natural frequencies, whereby it is able to withstand earthquakes.

7 Claims, 4 Drawing Sheets

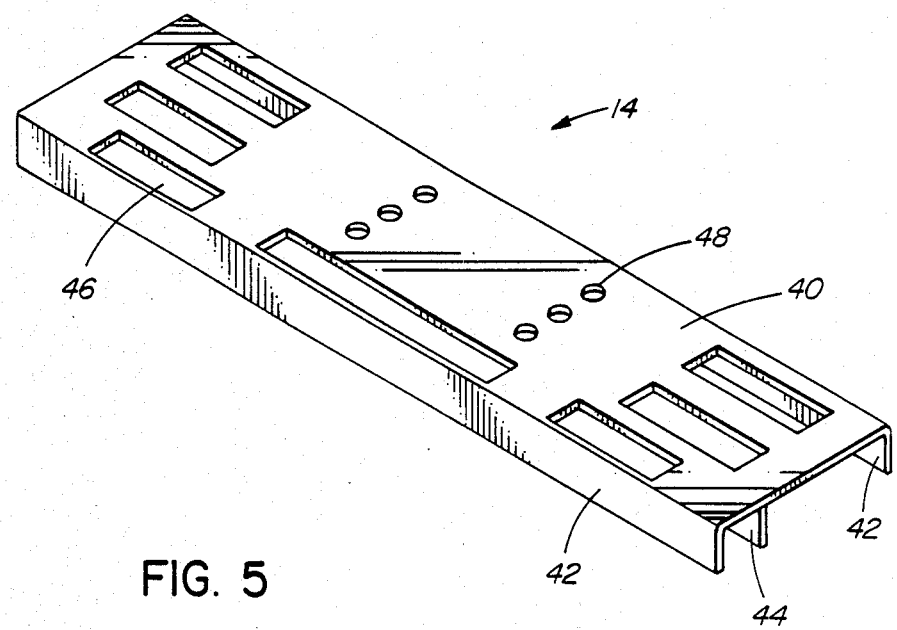
FIG. 5
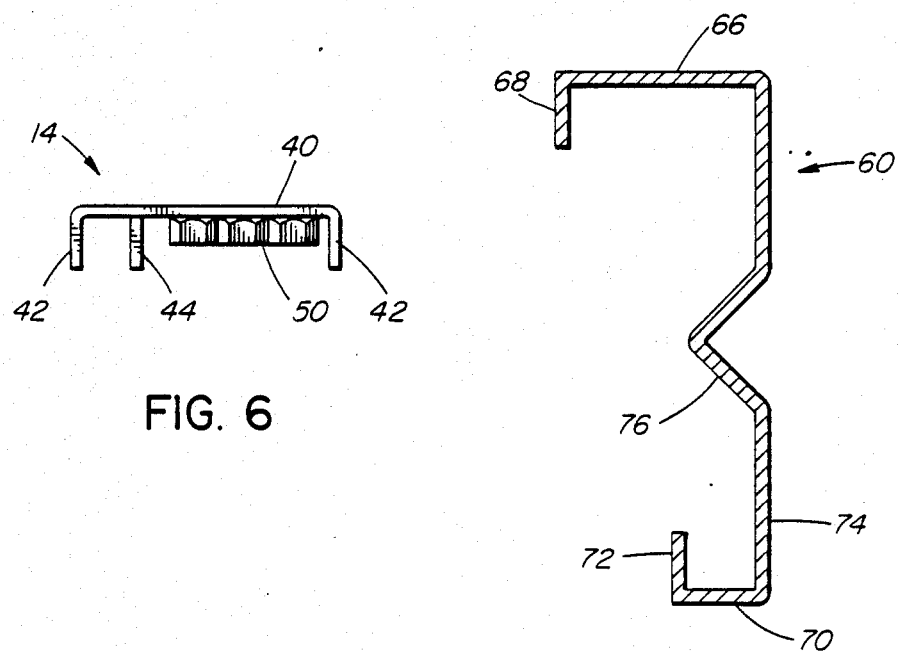
FIG. 6
FIG. 10

EARTHQUAKE-RESISTANT ELECTRONIC EQUIPMENT FRAME

This invention relates to electronic equipment frames, and is particularly concerned with earthquake-resistant frames for communications equipment.

As there is a critical need for communications immediately after an earthquake in a populated area, it is important for communications equipment to be able to withstand the most severe earthquakes or seismic shocks which can be expected to occur in the vicinity of such equipment. Traditionally, such equipment has been provided using modular components mounted in equipment frames, and earthquake protection has been achieved by providing each installation with relatively massive bracing and/or mechanical stiffening, as necessary for the earthquake zone in which the equipment is installed.

Free-standing electronic equipment frames typically have low natural resonance frequencies in the range from 1 to 10 Hz. In earthquakes, the highest energy dissipation occurs in the 4 to 5 Hz region, thereby making the frames vulnerable to earthquake induced damage. Increasing the natural frequency of the frames above this range decreases their sensitivity.

During seismic motion the base of a tall, slender, frame moves with the floor to which it is anchored. If the frame is sufficiently rigid and well anchored it will closely follow the motions of the base and floor. If, however, the frame is more flexible, it will move at a rate different to that of the base and floor, and consequently it may experience high stresses and deflections.

Since ground motion is amplified by the dynamic response of the building, the frequency of floor motion on an upper floor of a building may be much higher than that at ground level. If the natural frequency of the frame is sufficiently low, the frequency of floor motion may match that of the frame, causing resonance. In this state, the frame will amplify any motion received from the floor and undergo even larger deflections. It may then topple or collapse, resulting in serious damage to components within.

Accordingly, an object of this invention is to provide an electronic equipment frame which facilitates protection of equipment mounted therein from damage due to earthquakes and seismic motion.

According to this invention there is provided an electronic equipment frame comprising: a base; two elongate side members, secured to and extending upwardly from the base, for supporting electronic equipment therebetween; and a top member secured to and extending between upper ends of the side members; each side member having a front flange, a rear flange, and a central portion extending therebetween, the central portion including an inverted-V portion extending from a general plane of the central portion on the same side thereof as the front and rear flanges, along substantially the entire length of the side member.

The invention will be further understood from the following description with reference to the accompanying drawings, in which:

FIGS. 1, 2, and 3 illustrate front, side, and plan views respectively of a communications equipment frame in accordance with an embodiment of the invention;

FIGS. 5 and 6 illustrate a top member of the frame of FIGS. 1 to 3; and

FIGS. 7 to 10 illustrate a side member of the frame of FIGS. 1 to 3.

Figure 1:
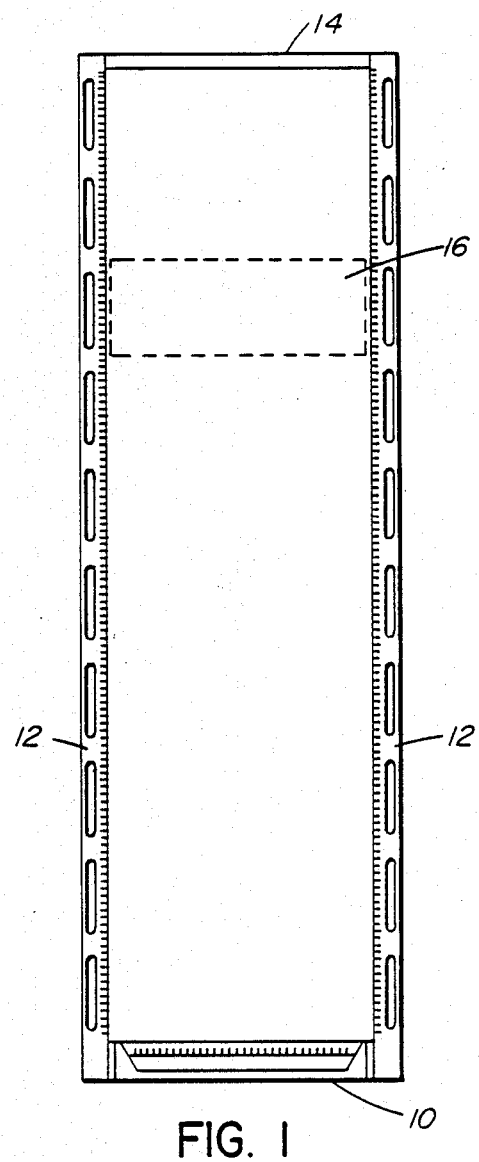
Figure 2:
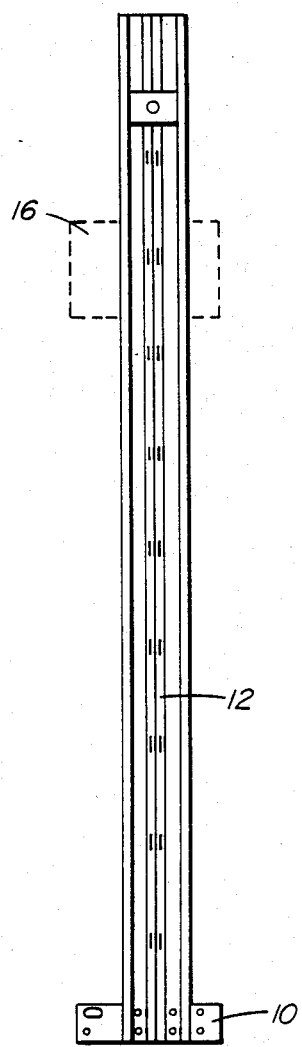
Figure 3:
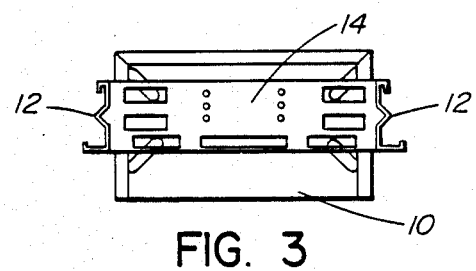

Referring to FIGS. 1 to 3, the communications equipment frame illustrated therein comprises a base 10, two side members 12, and a top member 14, and is intended for supporting in known manner modular shelves of communications equipment, such as a shelf 16 represented by broken lines in FIGS. 1 and 2. The top member 14 is welded to the side members 12, which are bolted to the base 10. The base 10 is anchored by bolts to a concrete floor in which the communications equipment carried in use by the frame is ultimately installed.

Figure 4:
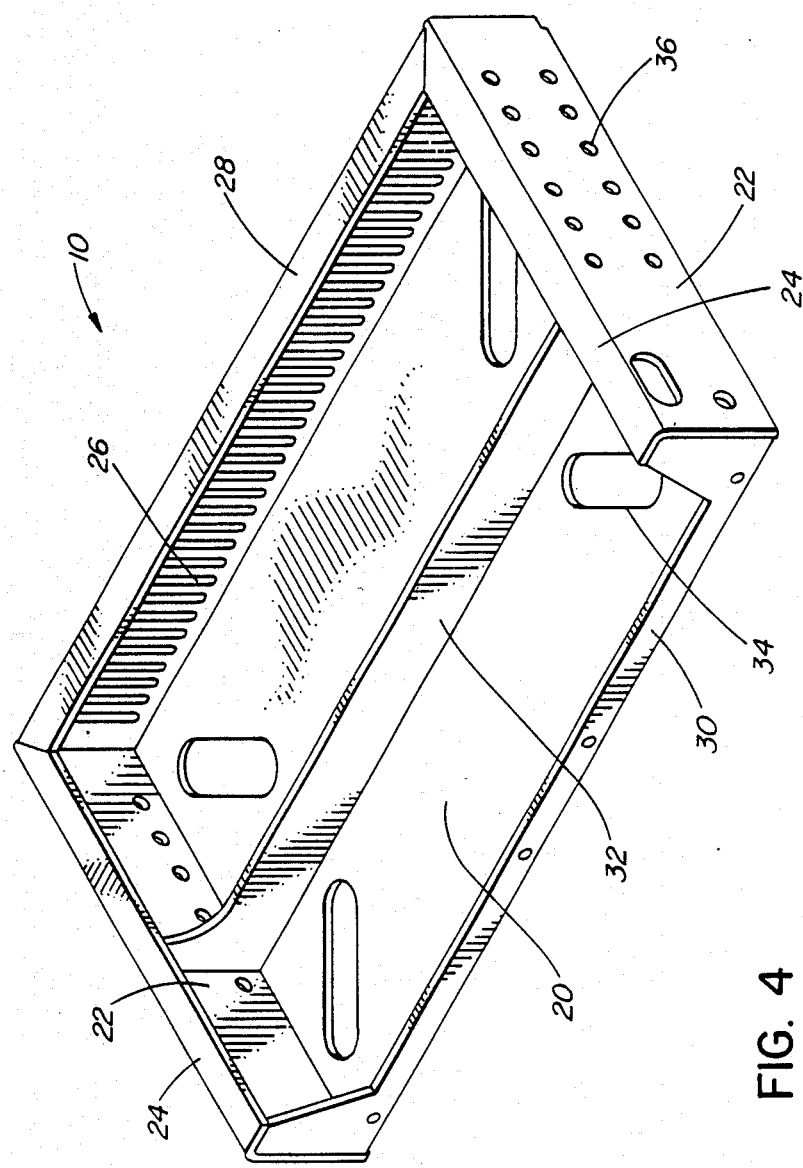
FIG. 4 illustrates a base of the frame of FIGS. 1 to 3.

The base 10 is shown in greater detail in FIG. 4, and comprises a floor 20, vertical sides 22 terminating in upper horizontal flanges 24, a vertical back 26 also terminating in an upper horizontal flange 28, a recessed front 30, and a vertical transverse member 32 extending between the sides 22. The joints between the various parts of the base 10 are seam welded for strength and rigidity. The floor 20 includes four angled slots 34 via which the anchor bolts referred to above extend for securing the base 10 to a concrete floor. The sides 22 include an array of holes 36 via four of which each side member 12 is bolted to a respective side 22. The back 26 includes vertical louvres to facilitate ventilation.

FIGS. 5 and 6 illustrate the top member 14 in greater detail, FIG. 5 showing an isometric view and FIG. 6 showing an end elevation. The top member 14 comprises a member 40 with front and back flanges 42 depending therefrom, and a stiffening bar 44 also depending therefrom and extending transversely parallel to the flanges 42 and positioned therebetween. Rectangular apertures 46 in the member 40 allow for the anchoring of cable ducts that carry the cables from and to the communications equipment. The member 40 also includes holes 48, with nuts 50 aligned therewith and welded to the underside of the member 40, to permit bolts to be screwed therein to fit any framework extension that would be needed by customers due to changes in ceiling heights of their central offices.

Figure 7:
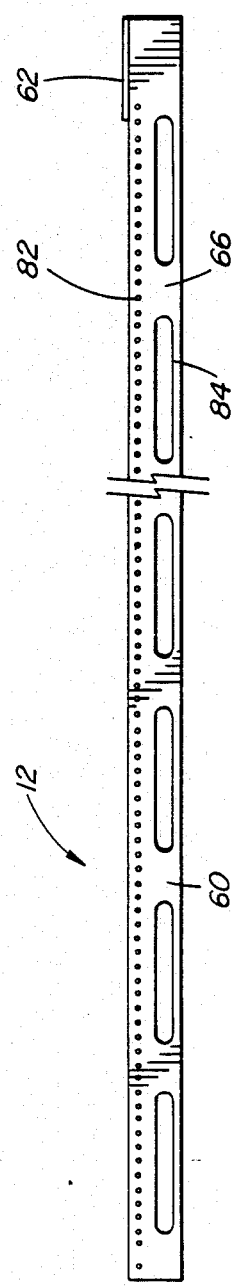
Figure 8:
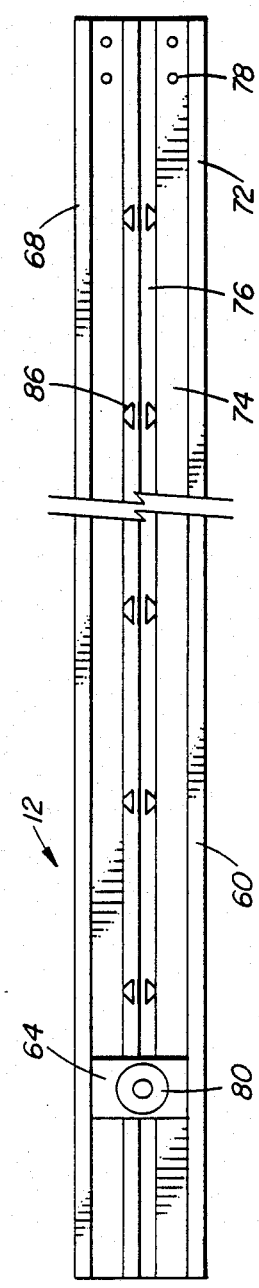
Figure 9:
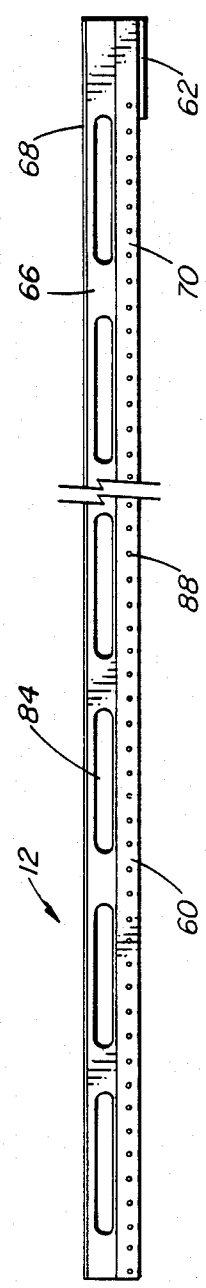

FIGS. 7 to 10 illustrate the left (as viewed in FIG. 1) side member 12 in greater detail; the right side member 12 has a similar but mirrored form. In each of FIGS. 7 to 9, the top end of the side member 12 is shown at the left of the drawing, and the bottom end at the right. FIGS. 7 to 9 show the side member 12 as seen from respectively the front, left, and rear of the frame as illustrated in FIG. 1.

The side member 12 comprises an elongate member 60, to which are welded a bottom plate 62 and an upper bossed plate 64 as described further below. FIG. 10 illustrates a general cross-section of the elongate member 60.

Referring to FIG. 10, the elongate member 60 has a general cross-section comprising a relatively wide front flange 66 terminating in a perpendicular rearwardly-directed lip 68, a relatively narrow rear flange 70 terminating in a perpendicular forwardly-directed lip 72, and a central portion 74 extending perpendicularly to the flanges 66 and 70 between the unlipped edges thereof, the central portion 74 having centrally therein an upstanding inverted-V portion 76 extending from the general plane of the central portion 74 on the same side as the flanges 66 and 70. The inverted-V portion 76 thus lies between the flanges 66 and 70, and in this embodiment of the invention has an apical angle of 90 degrees.

As shown in FIGS. 7 and 9, the bottom plate 62 is welded to the central portion 74 of the member 60 at its bottom end, and as shown in FIG. 8 four holes 78 extend through the member 60 and plate 62 via which the side member 12 is bolted to the base 10 as discussed above. As shown in FIG. 8, the plate 64 is welded to the central portion 74 of the member 60 towards its top end, the inverted-V portion 76 being removed at this point, and carries a threaded boss 80 into which a lifting hook may be screwed, to provide on each side of the frame a lifting point for the frame and equipment carried therein.

As shown in FIG. 7, the relatively wide front flange 66 has, regularly spaced along substantially its entire length adjacent the central portion 74, holes 82 for use in mounting shelves such as the shelf 16 in FIGS. 1 and 2. As shown in FIGS. 7 and 9, this flange 66 also has, adjacent the lip 68, elongate slots 84 through which cables from the front of such shelves can be routed to run within a cable duct defined between the flanges 66 and 70. For securing cables within the duct, as shown in FIG. 8 the inverted-V portion 76 has spaced periodically along its length apertures or knock-outs 86 which enable cable ties to pass therethrough.

As shown in FIG. 9, the relatively narrow rear flange 70 also has holes 88 spaced along substantially its entire length, to which plates may be attached for securing together adjacent equipment frames positioned side-by-side.

A frame as described above, using one-eighth inch thick steel for the side members 12 and three-sixteenths inch thick steel for the base 10 and top member 14, has relatively high natural frequencies and can be provided at relatively low cost. Such a frame has been found, from earthquake simulation testing on a horizontal shaking table, to meet standards prescribed for upper floor locations in buildings, in accordance with Bell Communications Research Specifications in their document TR-EOP-000063, Network Equipment-Building System (NEBS) General Equipment Requirements.

Although a particular embodiment of the invention has been described above, it should be appreciated that numerous modifications, variations, and adaptations may be made thereto without departing from the scope of the invention as defined in the claims.

What is claimed is:

1. An earthquake-resistant electronic equipment frame comprising:
   a base;
   two elongate substantially parallel side members, secured to and extending upwardly from the base, including means for supporting electronic equipment therebetween; and
   a top member secured to and extended between upper ends of the side members;
   each side member having a cross-section consisting of a front flange, a rear flange, and a central portion extending therebetween, the central portion including an inverted-V portion extending from a general plane of the central portion of each side member on the same side thereof as the front and rear flanges, along substantially the entire length of the side member, and the front and rear flanges of each side member extending a substantially different distance from the central portion of each respective side member.

2. An electronic equipment frame as claimed in claim 1 wherein the top member is welded and the base is bolted to the side members.

3. An electronic equipment frame as claimed in claim 1 wherein for each side member the front flange extends further from the central portion than the rear flange.

4. An electronic equipment frame as claimed in claim 1 wherein for each side member the flanges are substantially perpendicular to the general plane of the central portion of the side member.

5. An electronic equipment frame as claimed in claim 1 wherein each side member includes a lip on an elongate edge of each flange, the lips being substantially perpendicular to the respective flanges.

6. An electronic equipment frame as claimed in claim 1 wherein the inverted-V portion of each side member has apertures spaced along its length.

7. An electronic equipment frame as claimed in claim 1 wherein the inverted-V portion has an apical angle of substantially 90 degrees.

* * * * *